(12) United States Patent
Stultz et al.

(10) Patent No.: US 8,502,595 B2
(45) Date of Patent: Aug. 6, 2013

(54) POWER DOWN ENABLED ANALOG SWITCH

(75) Inventors: Julie Lynn Stultz, Scarborough, ME (US); James Joseph Morra, Cape Elizabeth, ME (US); Steven Macaluso, Scarborough, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/428,218

(22) Filed: Mar. 23, 2012

(65) Prior Publication Data
US 2012/0242397 A1 Sep. 27, 2012

Related U.S. Application Data

(60) Provisional application No. 61/465,776, filed on Mar. 23, 2011.

(51) Int. Cl.
*H03K 17/56* (2006.01)
(52) U.S. Cl.
USPC ............................ 327/427; 327/434; 333/103
(58) Field of Classification Search
USPC ............................ 327/427, 434; 333/101–103
See application file for complete search history.

(56) References Cited

U.S. PATENT DOCUMENTS

| | | | | |
|---|---|---|---|---|
| 3,908,136 A * | 9/1975 | Desperques-Volmier | .... | 327/427 |
| 4,835,649 A * | 5/1989 | Salerno | ............................ | 361/18 |
| 5,539,610 A * | 7/1996 | Williams et al. | .............. | 361/246 |
| 6,469,564 B1 * | 10/2002 | Jansen | ........................... | 327/365 |
| 6,504,424 B1 * | 1/2003 | Heminger et al. | ............ | 327/566 |

* cited by examiner

*Primary Examiner* — Kenneth B. Wells
(74) *Attorney, Agent, or Firm* — Schwegman Lundberg & Woessner P.A.

(57) ABSTRACT

This document discusses, among other things, apparatus and methods for passing a signal in a power down state. An example switch device can include a first depletion-mode transistor configured to pass an analog signal between a first node and a second node in a first state and to isolate the first node from the second node in a second state, a control circuit coupled to a control node of the first depletion-mode transistor and configured to isolate the control node from a first supply input in the first state and to couple the control node to the first supply input in the second state, and a tracking circuit configured to couple the control node of the first depletion-mode transistor to the first node during the first state and to isolate the control node of the first depletion-mode transistor from the first node in the second state.

20 Claims, 4 Drawing Sheets

POWER DOWN ENABLED ANALOG SWITCH

CLAIM OF PRIORITY

This patent application claims the benefit of priority, under 35 U.S.C. Section 119(e), to Stultz et al., U.S. Provisional patent application Ser. No. 61/465,776, entitled "AUDIO SWITCH NORMALLY ENABLED DURING POWER DOWN," filed on Mar. 23, 2011, which is hereby incorporated by reference herein in its entirety.

BACKGROUND

Many analog switches require a power supply to be present for the analog switch to enable and realize a positive gate-to-source voltage ($V_{GS}$) to pass a signal swinging around ground. During power down conditions, many n-type metal-oxide-semiconductor (NMOS) analog switches do not have a positive $V_{GS}$ and cannot pass signals above ground. Likewise, during power down conditions, many p-type metal-oxide-semiconductor (PMOS) analog switches do not have a negative $V_{GS}$ and cannot pass signals below ground. Further, traditional complimentary metal-oxide-semicondutor (CMOS) analog switches can allow signals to be passed but with significant signal distortion and poor quality.

OVERVIEW

This document discusses, among other things, apparatus and methods for passing a signal in a power down state. An example switch device can include a first depletion-mode transistor configured to pass an analog signal between a first node and a second node in a first state and to isolate the first node from the second node in a second state, a control circuit coupled to a control node of the first depletion-mode transistor and configured to isolate the control node from a first supply input in the first state and to couple the control node to the first supply input in the second state, and a tracking circuit configured to couple the control node of the first depletion-mode transistor to the first node during the first state and to isolate the control node of the first depletion-mode transistor from the first node in the second state.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, systems and methods configured to allow signals to be passed with superior quality and little distortion without power applied, and to not allow signals to be passed (e.g., disabling a switch) when power is applied. In an example, the switch can include a depletion-mode analog switch configured to pass an audio signal without applied power. In an example, the switch can be enabled with a constant 0V gate-to-source voltage ($V_{GS}$) signal providing optimal total harmonic distortion (THD) performance. When power is applied, the switch can be disabled. In an example, this implementation does not consume any substantial power to pass a signal.

Figure 1:
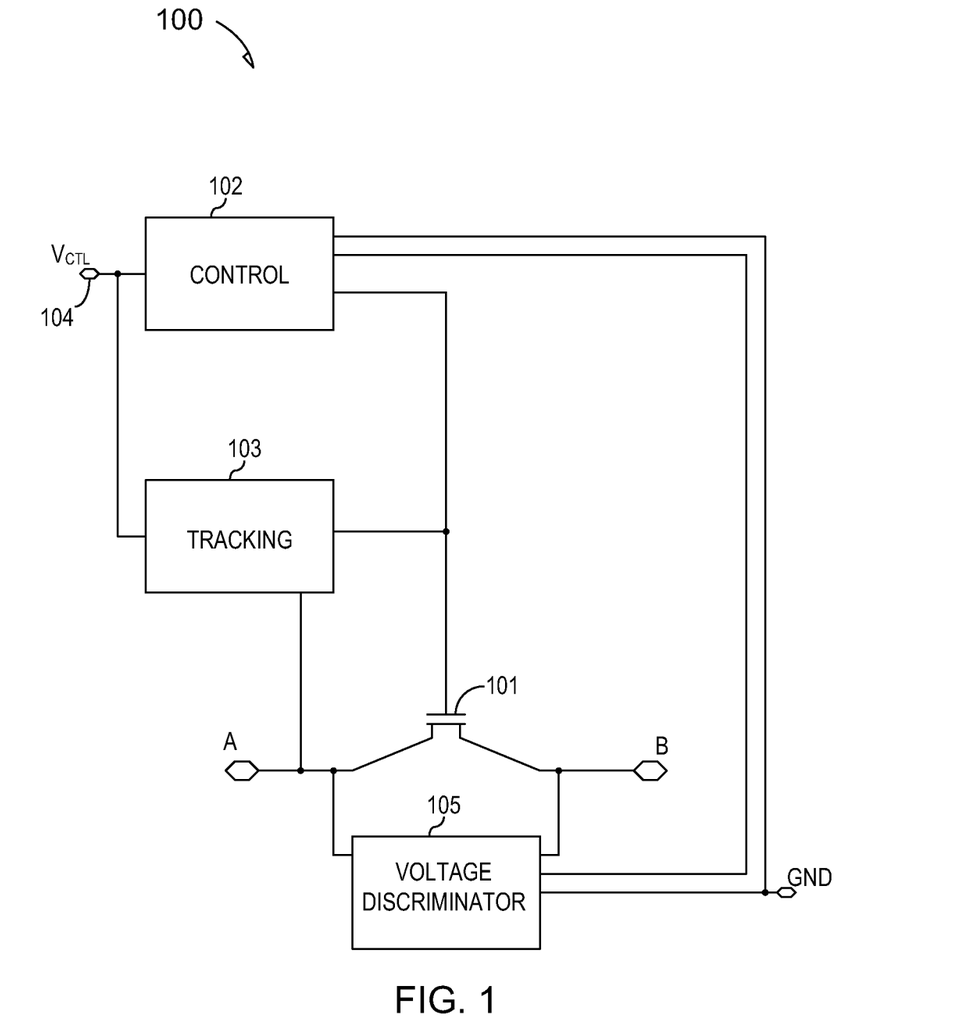
FIG. 1 illustrates generally an example switch device.

FIG. 1 illustrates generally an example switch device 100 including a depletion-mode transistor 101, a control circuit 102, and a tracking circuit 103. In certain examples, the control circuit 102 can include an input 104 configured to receive a control voltage ($V_{CTL}$). In an example, when the control voltage ($V_{CTL}$) is at or near ground (GND), the control circuit 102 can bias a control node of the depletion-mode transistor 101 such that the depletion-mode transistor 101 is enabled, or in a first state, and capable of passing a signal, such as an analog audio signal, between a first node (A) and a second node (B) of the switch device 100.

In some examples, the tracking circuit 103 can couple the control node of the depletion-mode transistor 101 to one of the first or second nodes (A, B) to maintain a substantially 0V $V_{GS}$ of the depletion-mode transistor 101. Thus, in the first state, the depletion-mode transistor 101 can pass a signal between the first and second nodes (A, B) with little or no distortion. In certain examples, the switch device 100 can receive a general supply voltage ($V_{CC}$) and the control voltage ($V_{CTL}$) can be the output voltage of a charge pump such that when the switch device 100 is in the first state, the control voltage ($V_{CTL}$) is substantially equal to 0V, such as ground, and when the switch device 100 is in the second state, the charge pump can be enabled and can provide the control voltage ($V_{CTL}$) having a substantial negative voltage, such as, in certain examples, about –2V.

In certain examples, when the control voltage ($V_{CTL}$) is at a first negative voltage level with respect to GND, the control circuit 102 can bias the control node of the depletion-mode transistor 101 such that the depletion-mode transistor 101 is disabled, electrically isolating the first node (A) and the second node (B) from each other. In some examples, the tracking circuit 103 can isolate the control node of the depletion-mode transistor 101 from one or both of the first and second nodes (A, B) to maintain a negative voltage across the gate and source of the depletion-mode transistor 101 in the second state. Thus, in the second state, the depletion-mode transistor 101 can electrically isolate the first and second nodes (A, B) from each other.

In certain examples, the switch device 100 can include a voltage discriminator 105 configured to provide a second reference voltage to the control circuit 102. In an example, the voltage discriminator 105 can receive a plurality of voltages and provide the lowest voltage of the plurality of voltages. In an example, the plurality of voltage can include the control voltage ($V_{CTL}$), the voltage at the first node (A), the voltage at the second node (B), GND, or a combination thereof.

Figure 2:
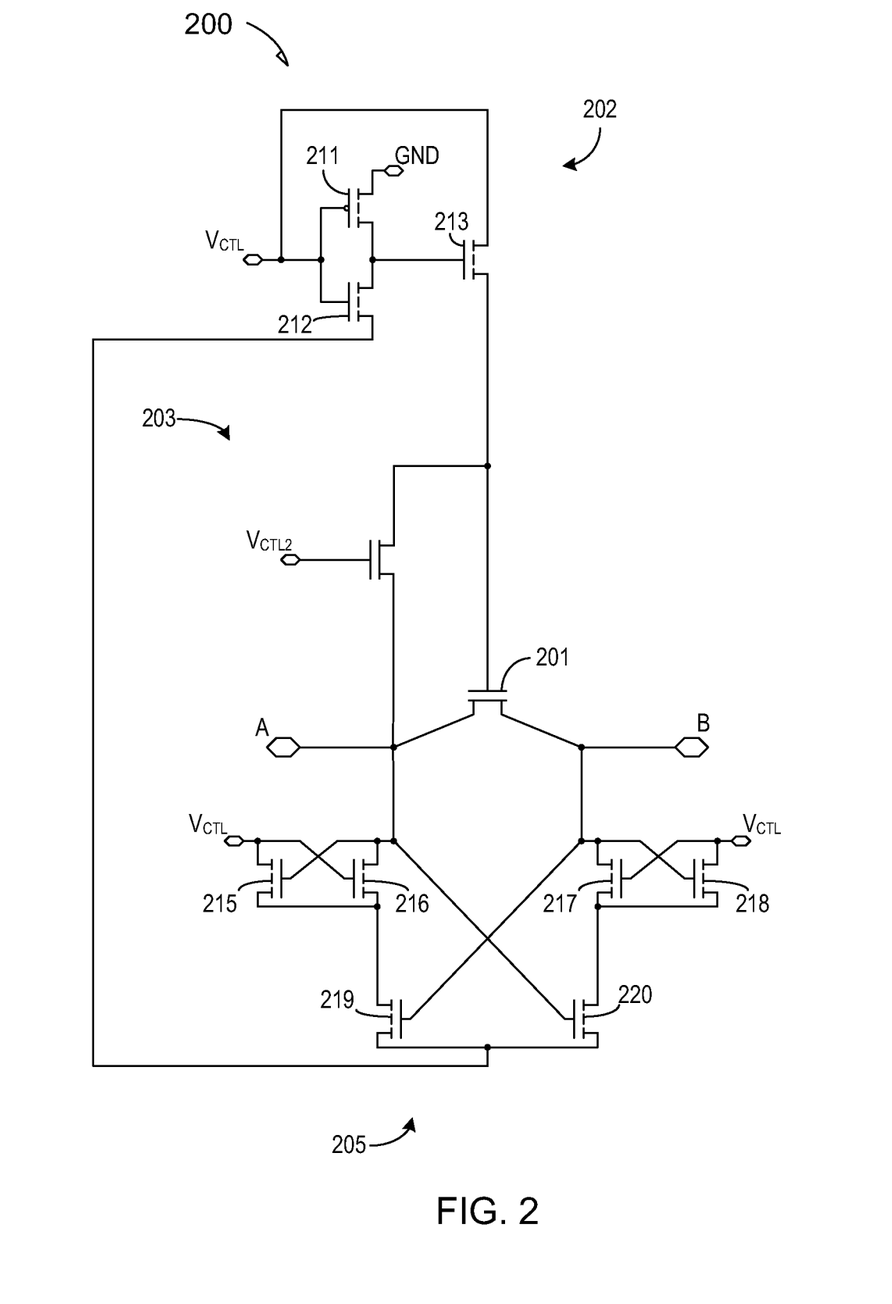
FIG. 2 illustrates generally an example switch device for passing an analog signal, such as an audio signal, between two nodes.

FIG. 2 illustrates generally an example switch device 200 for passing an analog signal, such as an audio signal, between two nodes (A, B) when a control voltage ($V_{CTL}$) is at or near a reference potential such as ground (GND). In certain examples, the switch device 200 can include a first depletion-mode transistor 201, a control circuit 202, a tracking circuit 203, and a voltage discriminator 205. In a first state of the switch device 200, the first depletion-mode transistor 201 can pass an analog signal between the first node (A) and the second node (B) when the first depletion-mode transistor 201 is enabled, such as when a gate-to-source voltage ($V_{GS}$) of the first depletion-mode transistor 201 is at or near 0V.

In certain examples, the control circuit 202 can receive a control voltage ($V_{CTL}$) and control a control node of the first depletion-mode transistor 201 using the voltage level of the control voltage ($V_{CTL}$). In some examples, the control circuit 202 can include a pair of transistors 211, 212 coupled as an inverter and a third transistor 213. In certain examples, the third transistor 213 can be configured to isolate the control voltage ($V_{CTL}$) from the control node of the first depletion-mode transistor 201 in a first state to allow the first depletion-mode transistor 201 to enable the first depletion-mode transistor 201, and to couple the control voltage ($V_{CTL}$) to the control node in a second state to disable the first depletion-mode transistor 201. In an example, the inverter coupled transistors 211, 212 can include a p-type metal-oxide-semiconductor (PMOS) enhancement-mode transistor 211 coupled to GND and an n-type metal-oxide-semiconductor (NMOS) enhancement-mode transistor 212 coupled to the voltage discriminator 205 via a supply rail (NRail).

In the first state of the switch device 200, the control voltage ($V_{CTL}$) can be at or near GND and the NMOS enhancement-mode transistor 212 can turn on and couple the voltage discriminator 205 to the control node of the third transistor 213. The voltage discriminator 205 can provide the lowest voltage of two or more voltages, such as the lowest voltage of the control voltage ($V_{CTL}$) or the voltage present at one or both of the first and second nodes (A, B). The low voltage presented at the control node of the third transistor 213 from the voltage discriminator 205 can allow the first depletion-mode transistor 201 to enable and pass the analog signal.

In the second state of the switch device 200, the control voltage ($V_{CTL}$) can be at a negative voltage level configured to disable the first depletion-mode transistor 201. $V_{CTL}$ can turn on the PMOS enhancement-mode transistor 211 and the PMOS enhancement-mode transistor 211 can couple the control node of the third transistor to GND. Because the control voltage ($V_{CTL}$) is a negative voltage relative to GND, the third transistor 213 can turn on when the gate, or the control node, of the third transistor 213 is coupled to GND. Upon turning on, the third transistor 213 of the control circuit 202 can couple the control node of the first depletion-mode transistor 201 to the negative control voltage ($V_{CTL}$), thus allowing the first depletion-mode transistor 201 to electrically isolate the first and second nodes (A, B) from each other. In certain examples, the third transistor 213 can include an enhancement-mode transistor, such as an NMOS enhancement-mode transistor.

In certain examples, the tracking circuit 203 can include a second depletion-mode transistor 214. In the first state of the switch device 200, the second depletion-mode transistor 214 can assure that a steady, substantially 0V $V_{GS}$ is maintained across the gate and source of the first depletion-mode transistor 201 by coupling the control node of the first depletion-mode transistor 201 to the first node (A). In the first state, the control node of the second depletion-mode transistor 214 can be at or near 0V such that the second depletion-mode transistor 214 includes a conductive channel. In the second state of the switch device 200, the control node of the second depletion-mode transistor 214 can be coupled to a second control voltage ($V_{CTL2}$) to disable the second depletion-mode transistor 214. In certain examples, the control voltage ($V_{CTL}$) received at the input 104 of the switch device 200 can be at a first negative voltage and the second control voltage ($V_{CTL}$) can be at a second negative voltage to disable the first depletion-mode transistor 201 when the second control voltage ($V_{CTL2}$) is more negative than first control voltage ($V_{CTL}$). The control node of the first depletion-mode transistor 201 can be electrically isolated from the first node (A) using the disabled second depletion-mode transistor 214 in the second state of the switch device 200. It is understood that the tracking circuit 203 can optionally couple the second node (B) with the control node of the first depletion-mode transistor 201 in the first state and can isolate the second node (B) from the control node of the first depletion-mode transistor 201 in the second state, without departing from the scope of the present subject matter.

In general, a voltage discriminator can include a pair of cross coupled transistors to discriminate a higher or lower voltage level of two voltage inputs. In the example switch device 200 of FIG. 2, the voltage discriminator 205 can include two pairs of cross coupled transistors 215, 216, and 217, 218, respectively, and a third pair of transistors 219, 220 to discriminate the lowest voltage of three voltages received by the voltage discriminator 205. In certain examples, the three voltages received by the voltage discriminator 205 can include the control voltage ($V_{CTL}$), the voltage at the first node (A), and the voltage at the second node (B).

Figure 3A:
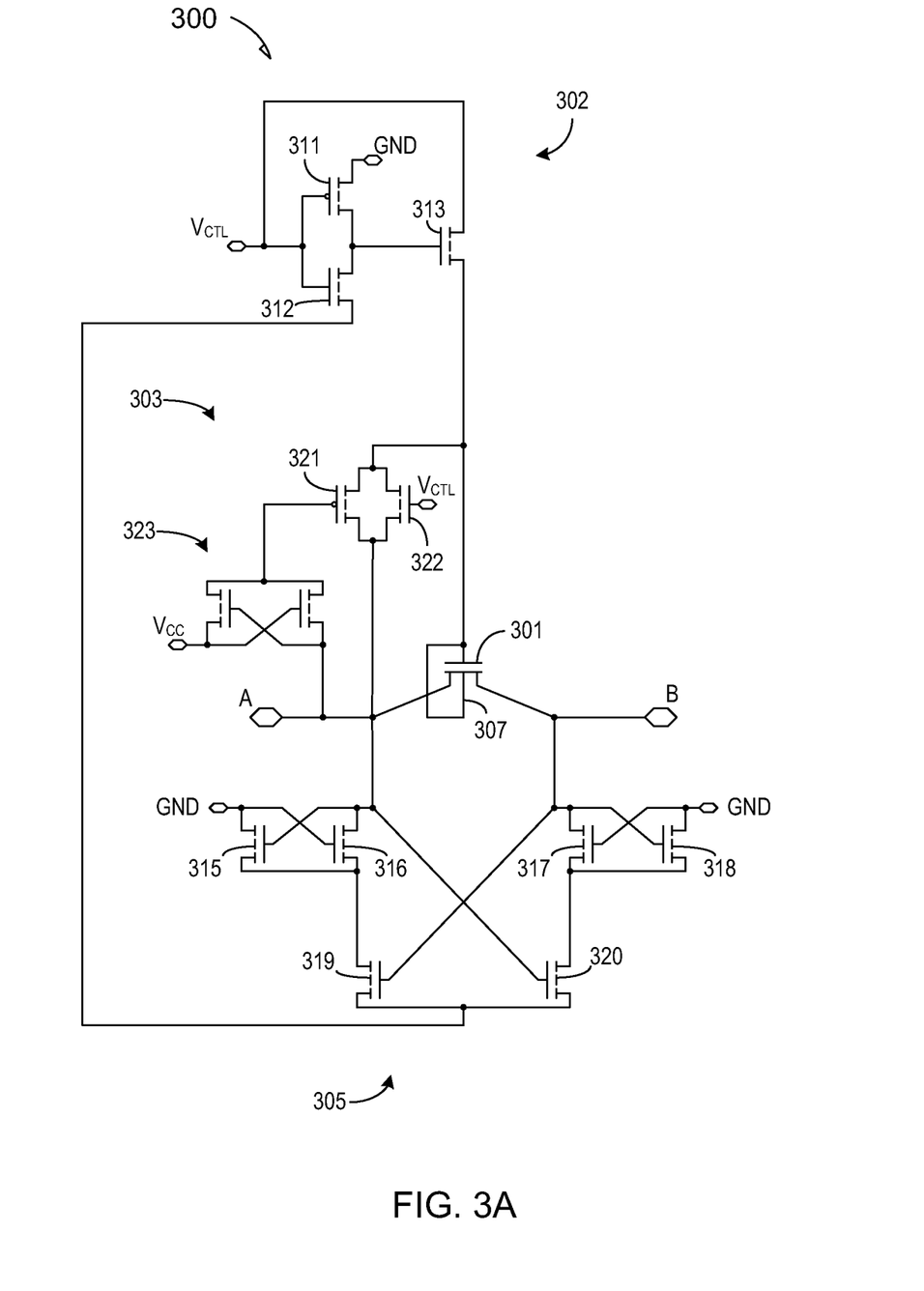
FIGS. 3A and 3B illustrate generally an example switch device for passing an analog signal during a power down state of an apparatus including the switch device.

FIG. 3A illustrates generally an example switch device 300 for passing an analog signal during a power down state of an apparatus including the switch device 300. The switch device 300 can include a depletion-mode transistor 301, a control circuit 302, a tracking circuit 303 and a first voltage discriminator 305. In a first state of the switch device 300, the deletion mode transistor 301 can pass an analog signal between a first node (A) and a second node (B) such as when a gate-to-source voltage ($V_{GS}$) of the first depletion-mode transistor 301 is at or near 0V. In a second state of the switch device 300, the deletion mode transistor 301 can isolate the first node (A) and the second node (B) from each other such as when a $V_{GS}$ of the first depletion-mode transistor 301 is at a negative voltage that substantially eliminates the conductive channel of the first depletion-mode transistor 301.

In certain examples, the control circuit 302 can receive a control voltage ($V_{CTL}$) and controls a control node of the first depletion-mode transistor 301 in response to a voltage level of the control voltage ($V_{CTL}$). In some examples, the control circuit 302 can include a pair of transistors 311, 312 coupled as an inverter and a third transistor 313. In certain examples, the third transistor 313 can be configured to isolate the control voltage ($V_{CTL}$) from the control node of the first depletion-mode transistor 301 in a first state to allow the first depletion-mode transistor 301 to enable the first depletion-mode transistor 301, and to couple the control voltage ($V_{CTL}$) to the control node in a second state to disable the first depletion-mode transistor 301. In an example, the inverter coupled transistors 311, 312 can include a PMOS enhancement-mode transistor 311 coupled to ground (GND) and an NMOS enhancement-mode transistor 312 coupled to the voltage discriminator 305 via a supply rail (NRail).

In the first state of the switch device 300, the control voltage ($V_{CTL}$) can be at or near ground, and the NMOS enhancement-mode transistor 312 of the control circuit 302 can turn on and couple the voltage discriminator 305 to the control node of the third transistor 313 of the control circuit 302. The voltage discriminator 305 can provide the lowest voltage of two or more voltages. In an example, the voltage discriminator 305 can provide the lowest voltage of the control voltage ($V_{CTL}$) or the voltage present at one or both of the first and second nodes (A, B). The low voltage presented at the control node of the third transistor 313 from the voltage discriminator 305 can allow the depletion-mode transistor 301 to enable and pass the analog signal.

In the second state of the switch device 300, the control voltage ($V_{CTL}$) can be at a negative voltage level configured to disable the depletion-mode transistor 301. The control voltage ($V_{CTL}$) can turn on the PMOS enhancement-mode transistor 311 and the PMOS enhancement-mode transistor 311 can couple the control node of the third transistor 313 to GND. Because the control voltage ($V_{CTL}$) is a negative voltage relative to GND, the third transistor 313 can turn on when the gate, or control node, of the third transistor 313 is coupled to ground. Upon turning on, the third transistor 313 of the control circuit 302 can couple the control node of the depletion-mode transistor 301 to the negative control voltage ($V_{CTL}$) thus allowing the enhancement-mode transistor 301 to electrically isolated the first and second nodes (A, B) from each other. In certain examples, the third transistor 313 can include an enhancement-mode transistor such as an NMOS enhancement-mode transistor.

In certain examples, the tracking circuit 303 can include a pair of enhancement-mode transistors 321, 322 coupled in parallel and a tracking voltage discriminator 323. In certain examples, the tracking circuit 303 can be coupled to the first node (A). In an example, parallel connected transistors 321, 322 of the tracking circuit 303 can include low threshold-voltage CMOS transistors. The parallel connected transistors 321, 322 of the tracking circuit 303 can improve the performance of the switch device 300 over other tracking circuits, such as a tracking circuit using a second depletion-mode device because the depletion-mode device can lose linearity and overdrive as the signal voltage increases.

In general, the tracking circuit 303 can be configured to ensure a substantially constant ON-resistance of the depletion-mode transistor 301 as the depletion-mode transistor 301 passes a signal between the first and second nodes (A, B) in the first state of the switch device 300. A substantially constant ON-resistance can allow the signal to pass between the first and second nodes (A, B) with little or no distortion. Thus, audio signals, for example, can pass from one device to another without significantly deteriorating the fidelity of the sound.

In certain examples, the tracking circuit 303 can allow the control node of the depletion-mode transistor 301 to track the signal passing between the first and second nodes (A, B) such that a nearly 0V $V_{GS}$ is maintained on the depletion-mode transistor 301. In an example, during the first state of the switch device 300, such as during power down of the apparatus including the switch device 300, the control voltage ($V_{CTL}$) and the general supply voltage ($V_{CC}$) can be 0V with respect to GND. Further, the control node of an NMOS transistor 322 of the tracking circuit 303 can be coupled to the control voltage ($V_{CTL}$) such that when the voltage level of the signal at the first node (A) is above ground, the NMOS transistor 322 of the tracking circuit 303 can couple the first node (A) to the control node of the depletion-mode transistor 301. Although not shown, in the same example, the control node of a PMOS transistor 321 of the tracking circuit 303 can be coupled to the general supply voltage ($V_{CC}$), such that when the voltage level of the signal at the first node (A) is below ground the PMOS transistor 321 can couple the first node (A) to the control node of the depletion-mode transistor 301 to maintain a substantially 0V $V_{GS}$ across the gate and source of the depletion-mode transistor 301.

In some examples, instead of coupling the control node of the PMOS transistor 321 of the tracking circuit to the general supply voltage ($V_{CC}$), the control node of the PMOS transistor 321 of the tracking circuit 303 can be coupled to a tracking voltage discriminator 323. The tracking voltage discriminator 323 can couple the control node of the PMOS transistor 321 to the lowest voltage of either the general supply voltage ($V_{CC}$) or the voltage present at the first node (A). Such an arrangement can reduce stress to the PMOS transistor 321 in the second state of the switch device when the general supply voltage ($V_{CC}$) can have a substantial positive voltage and the control voltage ($V_{CTL}$) can have a substantial negative voltage. In certain examples, the general supply voltage ($V_{CC}$) can supply power to a charge pump that supplies the control voltage ($V_{CTL}$).

Figure 3B:
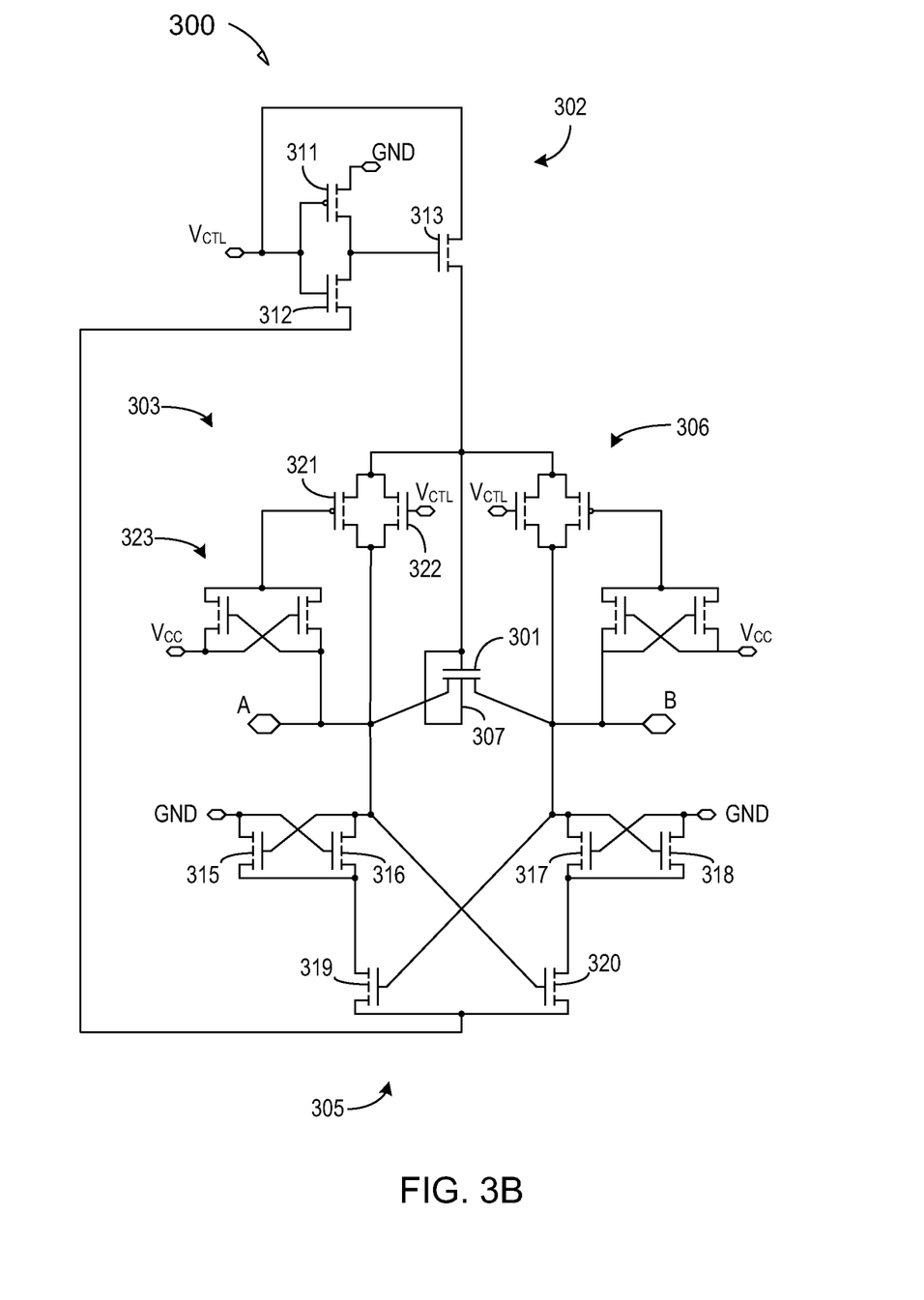

FIG. 3B illustrates generally an example switch device 300 including a first tracking circuit 303 and a second tracking circuit 306. In an example, the first tracking circuit 303 can be coupled to the first node (A) and the second tracking circuit 306 can be coupled to the second node (B). Such a configuration can be associated with a switch device where either the first or second nodes (A, B) can independently be driven with an analog signal.

In certain examples, the bulk, or back gate 307, of the depletion-mode transistor 301 can be coupled to the control node to optimize total harmonic distortion in the first state of the switch device 300 and to substantially eliminate the conductive channel of the depletion-mode transistor 301 in the second state because, like the control node, the back gate 307 can also be coupled to a substantial negative voltage in the second state.

The voltage discriminator 305 can include two pairs of cross coupled transistors 315, 316, and 317, 318 and a third pair of transistors (319, 320) to discriminate the lowest voltage of three voltages received by the voltage discriminator 305. In certain examples, the three voltages received by the voltage discriminator 305 can include the voltage at the first node (A), the voltage at the second node (B), and GND.

Additional Notes

In Example 1, a switch device can include a first depletion-mode transistor configured to pass an analog signal between a first node and a second node in a first state and to isolate the first node from the second node in a second state, a control circuit coupled to a control node of the first depletion-mode transistor, the control circuit configured to isolate the control node from a first supply input in the first state and to couple the control node to the first supply input in the second state, and a tracking circuit configured to couple the control node of the first depletion-mode transistor to the first node during the first state and to isolate the control node of the first depletion-mode transistor from the first node in the second state.

In Example 2, the control circuit of Example 1 optionally includes an inverter having an input coupled to the first supply input, and an enhancement-mode transistor configured to receive an output of the inverter and to control the control node using the output of the inverter.

In Example 3, the switch device of any one or more of Examples 1-2 optionally includes a first voltage discriminator coupled to the first node, wherein a first supply input of the inverter is configured to be coupled to ground, wherein a second supply input of the inverter is configured to be coupled to an output of the first voltage discriminator, and wherein the first voltage discriminator is configured to receive a plurality voltage levels and to provide, at the output of the first voltage discriminator, a voltage level substantially equal to the lowest of the plurality voltage levels.

In Example 4, the plurality of voltage levels of any one or more of Examples 1-3 optionally includes a voltage level of the supply input.

In Example 5, the plurality of voltage levels of any one or more of Examples 1-4 optionally includes a voltage level of the first node.

In Example 6, the switch device of any one or more of Examples 1-3 optionally includes a second voltage discriminator coupled to the second node and the output of the first discriminator, wherein the second voltage discriminator is configured to receive a second plurality voltage levels and to provide, at an output of the second voltage discriminator, a voltage level substantially equal to the lowest voltage level of the second plurality voltage levels, and wherein the second plurality of voltage levels includes a voltage level of the supply input and a voltage level of the second node.

In Example 7, the tracking circuit of any one or more of Examples 1-6 optionally includes a second depletion-mode transistor coupled to the control node of the first depletion-mode transistor, the second depletion-mode transistor configured to couple the control node of the first depletion-mode transistor to the first node in the first state and to isolate the control node of the first depletion-mode transistor from the first node in the second state.

In Example 8, the switch device of any one or more of Examples 1-3 optionally includes a second supply input coupled to a control node of the second depletion-mode transistor, wherein the first supply input and the second supply input are configured to receive a first voltage in the first state, wherein the first supply input is configured to receive a second voltage in the second state, wherein the second supply input is configured to receive a third voltage in the second state, and wherein the third voltage is lower than the second voltage and the second voltage is lower than the first voltage.

In Example 9, the tracking circuit of any one or more of Examples 1-8 optionally includes a first tracking circuit configured to couple the first node to the control node of the first depletion-mode transistor in the first state and to isolate the first node from the control node of the first depletion-mode device in the second state, wherein the first tracking circuit includes a PMOS transistor coupled in parallel with an NMOS transistor, wherein a control node of the NMOS transistor is coupled to the first supply, and wherein a control node of the PMOS transistor is coupled to the first node when a voltage level of the first node is lower than ground level in the first state.

in Example 10, the tracking circuit of any one or more of Examples 1-9 optionally includes a second tracking circuit configured to couple the second node to the control node of the first depletion-mode transistor in the first state, and to isolate the second node from the control node of the first depletion-mode device in the second state, wherein the first tracking circuit includes a PMOS transistor coupled in parallel with an NMOS transistor, wherein a control node of the NMOS transistor is coupled to the first supply, and wherein a control node of the PMOS transistor is coupled to the first node when a voltage level of the first node is lower than ground level in the first state.

In Example 11, the switch device of any one or more of Examples 1-10 optionally includes a third voltage discriminator configured to provide an output to control the PMOS transistor of the first tracking circuit and the PMOS transistor of the second tracking circuit.

In Example 12, a back gate of the first depletion-mode transistor of any one or more of Examples 1-11 optionally is coupled to the control node of the first depletion-mode transistor.

In Example 13, a method can include passing an analog signal between a first node and a second node using a first depletion-mode transistor in a first state, isolating the first node from the second node in using the first depletion-mode transistor in a second state, isolating a control node of the first depletion-mode transistor from a first supply input in the first state using a control circuit, coupling the control node of the first depletion-mode transistor to the first supply input in the second state using the control circuit, coupling the control node of the first depletion-mode transistor to the first node in the first state using a tracking circuit, and isolating the control node of the first depletion-mode transistor from the first node in the second state using the tracking circuit.

In Example 14, the coupling the control node of the first depletion-mode transistor to the first node of any one or more of Examples 1-13 optionally includes coupling the control node of the first depletion-mode transistor to the first node in the first state using a second depletion-mode transistor.

In Example 15, the isolating the first node from the second node of any one or more of Examples 1-14 optionally includes coupling a negative voltage to the first supply input.

In Example 16, the isolating the first node from the second node of any one or more of Examples 1-15 optionally includes coupling a second negative voltage to a control node of the second depletion-mode transistor.

In Example 17, the isolating a control node of the first depletion-mode transistor from a first supply input of any one or more of Examples 1-16 optionally includes coupling a control node of an output transistor of the control node to a supply rail using an inverter, wherein the output transistor is coupled to the first supply input, the control node of the first depletion-mode transistor and an output of the inverter.

In Example 18, the coupling a control node of an output transistor of the control node to a supply rail using an inverter of any one or more of Examples 1-17 optionally includes providing at the supply rail a lowest voltage using a voltage discriminator of voltages present at the first supply input, the first node and the second node.

In Example 19, the coupling the control node of the first depletion-mode transistor to the first node of any one or more of Examples 1-3 optionally includes coupling the control node of an NMOS transistor of a tracking circuit to the first supply input, and coupling a control node of a PMOS transistor of the tracking circuit to the first node when a voltage level of the first node is lower than ground level in the first state.

In Example 20, the method of any one or more of Examples 1-19 optionally includes coupling a back gate of the first depletion-mode transistor to the control node of the first depletion-mode transistor.

Example 21 can include, or can optionally be combined with any portion or combination of any portions of any one or more of Examples 1-20 to include, subject matter that can include means for performing any one or more of the functions of Examples 1-20, or a machine-readable medium including instructions that, when performed by a machine, cause the machine to perform any one or more of the functions of Examples 1-20.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A switch device comprising:
    a first depletion-mode transistor configured to pass an analog signal between a first node and a second node in a first state and to isolate the first node from the second node in a second state;
    a control circuit coupled to a control node of the first depletion-mode transistor, the control circuit configured to isolate the control node from a first supply input in the first state and to couple the control node to the first supply input in the second state; and
    a tracking circuit configured to couple the control node of the first depletion-mode transistor to the first node during the first state and to isolate the control node of the first depletion-mode transistor from the first node in the second state.

2. The switch device of claim 1, wherein the control circuit includes:
    an inverter having an input coupled to the first supply input; and
    an enhancement-mode transistor configured to receive an output of the inverter and to control the control node using the output of the inverter.

3. The switch device of claim 2, including a first voltage discriminator coupled to the first node;
    wherein a first supply input of the inverter is configured to be coupled to ground;
    wherein a second supply input of the inverter is configured to be coupled to an output of the first voltage discriminator; and
    wherein the first voltage discriminator is configured to receive a plurality voltage levels and to provide, at the output of the first voltage discriminator, a voltage level substantially equal to the lowest of the plurality voltage levels.

4. The switch device of claim 3, wherein the plurality of voltage levels includes a voltage level of the first or second supply input.

5. The switch device of claim 3, wherein the plurality of voltage levels includes a voltage level of the first node.

6. The switch device of claim 3, including a second voltage discriminator coupled to the second node and the output of the first discriminator;
    wherein the second voltage discriminator is configured to receive a second plurality voltage levels and to provide, at an output of the second voltage discriminator, a voltage level substantially equal to the lowest voltage level of the second plurality voltage levels; and
    wherein the second plurality of voltage levels includes a voltage level of the first or second supply input and a voltage level of the second node.

7. The switch device of claim 1, wherein the tracking circuit includes a second depletion-mode transistor coupled to the control node of the first depletion-mode transistor, the second depletion-mode transistor configured to couple the control node of the first depletion-mode transistor to the first node in the first state and to isolate the control node of the first depletion-mode transistor from the first node in the second state.

8. The switch device of claim 7, further including a second supply input coupled to a control node of the second depletion-mode transistor;
    wherein the first supply input and the second supply input are configured to receive a first voltage in the first state;

wherein the first supply input is configured to receive a second voltage in the second state;

wherein the second supply input is configured to receive a third voltage in the second state; and wherein the third voltage is lower than the second voltage and the second voltage is lower than the first voltage.

9. The switch device of claim 1, wherein the tracking circuit includes a first tracking circuit configured to couple the first node to the control node of the first depletion-mode transistor in the first state and to isolate the first node from the control node of the first depletion-mode device in the second state;

wherein the first tracking circuit includes a PMOS transistor coupled in parallel with an NMOS transistor;

wherein a control node of the NMOS transistor is coupled to the first supply; and wherein a control node of the PMOS transistor is coupled to the first node when a voltage level of the first node is lower than ground level in the first state.

10. The switch device of claim 9, wherein the tracking circuit includes a second tracking circuit configured to couple the second node to the control node of the first depletion-mode transistor in the first state, and to isolate the second node from the control node of the first depletion-mode device in the second state;

wherein the first tracking circuit includes a PMOS transistor coupled in parallel with an NMOS transistor;

wherein a control node of the NMOS transistor is coupled to the first supply; and wherein a control node of the PMOS transistor is coupled to the first node when a voltage level of the first node is lower than ground level in the first state.

11. The switch device of claim 10, including a third voltage discriminator configured to provide an output to control the PMOS transistor of the first tracking circuit and the PMOS transistor of the second tracking circuit.

12. The switch device of claim 1, wherein a back gate of the first depletion-mode transistor is coupled to the control node of the first depletion-mode transistor.

13. A method comprising:

passing an analog signal between a first node and a second node using a first depletion-mode transistor in a first state;

isolating the first node from the second node in using the first depletion-mode transistor in a second state;

isolating a control node of the first depletion-mode transistor from a first supply input in the first state using a control circuit;

coupling the control node of the first depletion-mode transistor to the first supply input in the second state using the control circuit;

coupling the control node of the first depletion-mode transistor to the first node in the first state using a tracking circuit; and isolating the control node of the first depletion-mode transistor from the first node in the second state using the tracking circuit.

14. The method of claim 13, wherein coupling the control node of the first depletion-mode transistor to the first node includes coupling the control node of the first depletion-mode transistor to the first node in the first state using a second depletion-mode transistor.

15. The method of claim 14, wherein isolating the first node from the second node includes coupling a negative voltage to the first supply input.

16. The method of claim 15, wherein isolating the first node from the second node includes coupling a second negative voltage to a control node of the second depletion-mode transistor.

17. The method of claim 13, wherein isolating a control node of the first depletion-mode transistor from a first supply input includes coupling a control node of an output transistor of the control node to a supply rail using an inverter, wherein the output transistor is coupled to the first supply input, the control node of the first depletion-mode transistor and an output of the inverter.

18. The method of claim 17, wherein coupling a control node of an output transistor of the control node to a supply rail using an inverter includes providing at the supply rail a lowest voltage using a voltage discriminator of voltages present at the first supply input, the first node and the second node.

19. The method of claim 13, wherein coupling the control node of the first depletion-mode transistor to the first node includes coupling the control node of an NMOS transistor of a tracking circuit to the first supply input; and coupling a control node of a PMOS transistor of the tracking circuit to the first node when a voltage level of the first node is lower than ground level in the first state.

20. The method of claim 13, including coupling a back gate of the first depletion-mode transistor to the control node of the first depletion-mode transistor.

* * * * *